United States Patent [19]

Debbaut

[11] Patent Number: 4,864,725
[45] Date of Patent: Sep. 12, 1989

[54] ELECTRICAL CONNECTOR AND METHOD OF SPLICING WIRES

[75] Inventor: Christian A. M. Debbaut, Cary, N.C.

[73] Assignee: Raychem Corporation, Menlo Park, Calif.

[21] Appl. No.: 183,546

[22] Filed: Apr. 18, 1988

Related U.S. Application Data

[63] Continuation of Ser. No. 38,415, Apr. 9, 1987, abandoned, which is a continuation of Ser. No. 756,559, Jul. 17, 1985, abandoned, which is a continuation of Ser. No. 507,433, Jun. 23, 1983, abandoned, which is a continuation-in-part of Ser. No. 434,011, Oct. 12, 1982, Pat. No. 4,600,261.

[51] Int. Cl.$^4$ .................. H01R 43/04; H01R 4/00
[52] U.S. Cl. .................. 29/871; 174/89 C; 174/93; 428/904; 524/848
[58] Field of Search .............. 29/858, 868, 871, 872; 174/76, 84 C, 84 R, 85, 88 C, 92, 93; 524/157, 267, 491, 848; 264/272.11; 428/904

[56] References Cited

U.S. PATENT DOCUMENTS

| | | | |
|---|---|---|---|
| Re. 30,321 | 7/1980 | Brauer et al. | 260/18 |
| Re. 31,389 | 9/1983 | Brauer et al. | 210/321.3 |
| 3,065,292 | 11/1962 | Chickvary . | |
| 3,187,088 | 6/1965 | Warner . | |
| 3,228,820 | 1/1966 | Samson | 156/307 |
| 3,243,211 | 3/1966 | Wetmore | 287/78 |
| 3,427,393 | 2/1969 | Masterson . | |
| 3,485,787 | 12/1969 | Haefele et al. | 260/33.6 |
| 3,619,481 | 11/1971 | Smith . | |
| 3,630,905 | 12/1971 | Sorgo | 260/85.1 |
| 3,649,436 | 5/1970 | Buese | 161/160 |
| 3,676,387 | 7/1972 | Lindlof | 260/28.5 |
| 3,678,174 | 7/1972 | Ganzhorn . | |
| 3,714,110 | 1/1973 | Verdol et al. . | |
| 3,718,619 | 2/1973 | Rustab . | |
| 3,731,258 | 5/1973 | Spicer . | |
| 3,755,241 | 8/1973 | Brady . | |
| 3,801,532 | 4/1974 | Olstowski . | |
| 3,827,999 | 8/1974 | Crossland | 260/33.6 |
| 3,846,355 | 11/1974 | Mayer . | |
| 3,897,129 | 7/1975 | Farrar, Jr. . | |
| 3,916,082 | 10/1975 | Gillemot . | |
| 3,928,704 | 12/1975 | Heidingsfeld et al. | 428/260 |
| 3,929,949 | 12/1975 | Day et al. | 264/46.4 |
| 3,934,076 | 1/1976 | Smith | 174/87 |
| 3,937,870 | 2/1976 | Bumpstead et al. | 174/87 |
| 3,985,951 | 10/1976 | Harris . | |
| 4,010,994 | 3/1977 | Aysta . | |
| 4,025,717 | 5/1977 | Whittingham . | |
| 4,039,742 | 8/1977 | Smith | 174/87 |
| 4,168,258 | 9/1979 | Brauer et al. | 260/33.6 |
| 4,171,998 | 10/1979 | Brauer et al. | 156/48 |
| 4,176,239 | 11/1979 | Brauer et al. | 174/23 |
| 4,208,788 | 6/1980 | Siden | 29/862 |
| 4,214,121 | 7/1980 | Charneski et al. . | |
| 4,231,986 | 11/1980 | Brauer et al. . | |
| 4,281,210 | 7/1981 | Brauer et al. | 179/23 |
| 4,297,155 | 10/1981 | Jervis . | |
| 4,326,767 | 4/1982 | Silbernagel et al. . | |
| 4,369,284 | 1/1983 | Chew . | |
| 4,423,918 | 1/1984 | Filreis et al. . | |
| 4,504,699 | 3/1985 | Dones et al. . | |

FOREIGN PATENT DOCUMENTS

| | | | |
|---|---|---|---|
| 46063 | 2/1982 | European Pat. Off. . | |
| 2070658 | 9/1981 | United Kingdom | 1/64 |

OTHER PUBLICATIONS

ASTM Designation 50/69(79) Std Test Methods for Cone Penetration of Lubricating Grease.

*Primary Examiner*—Howard N. Goldberg
*Assistant Examiner*—Carl J. Arbeg
*Attorney, Agent, or Firm*—Burns, Doane, Swecker & Mathis

[57] ABSTRACT

An article and process for splicing electrical wires that are to be exposed to an adverse environment. The article includes a connector, an insulating sleeve adapted to retain the connector, and an encapsulant. The encapsulant, which is disposed within the insulating sleeve, has a cone penetration value of 100 to 350 ($10^{-1}$ mm) and an ultimate elongation of at least 200%.

21 Claims, 2 Drawing Sheets

ELECTRICAL CONNECTOR AND METHOD OF SPLICING WIRES

This application is a continuation of application Ser. No. 38,415 filed Apr. 9, 1987, now abandoned, which is a continuation of application 756,559 filed July 17, 1985, now abandoned, which is a continuation of application 507,433, filed June 23, 1983, now abandoned, which is a continuation in part of application 434,011, filed Oct. 12, 1982, now U.S. Pat. No. 4,600,261.

TECHNICAL FIELD

The present invention relates to electrical connectors in which connection between electrical wires is effected by mechanical deformation of the connector.

BACKGROUND ART

It is well known to splice (i.e. connect) electrical wires by placing them within a connector and then permanently deforming the connector by mechanical pressure - see for example U.S. Pat. No. 4,208,788 to Siden. If the electrical wires so spliced are to be used in a corrrosive, moist or hazardous environment, it is desirable to provide an environmental seal in association with the pressure connector in order to maintain an acceptable electrical connection between the electrical wires.

Such environmental seals are known and include, for example, a special box which is designed to house the wire splice. In practice, however, the special box does not provide a hermetic seal; ultimately, moisture and/or other foreign substances may permeate the special box and induce corrosion within the wire splice.

Other known environmental seals include a method of covering the spliced wires with a silicone grease. The silicone grease, however, is unsatisfactory since it can coat apparatus that should remain clean, and is displaced by vibration.

Environmental seals further include a crimp splicer wherein there is an associated insulating heat shrinkable sleeve which is adapted to retain a crimp barrel therein. In practice, the heat shrinkable sleeve may be shrunk down around the barrel and electrical wires in order to protect the splice from the environment. In some cases, however, it is disadvantageous or even prohibited, to employ a heating unit to heatshrink the sleeve.

SUMMARY OF THE INVENTION

I have now discovered an improved electrical pressure connector, which protects the electrical wires from a corrosive, moist or hazardous environment. The apparatus of the present invention is easy and convenient to employ and dispenses with a need for grease or a heat unit.

In one aspect, the present invention provides a connector, an insulating sleeve adapted to retain the connector, and an encapsulant disposed within the insulating sleeve and/or the connector, the encapsulant having a cone penetration value of 150 to 350 ($10^{-1}$ mm) and an ultimate elongation of at least 200%.

In another aspect, the present invention provides a process for splicing electrical wires, comprising the steps of:
 (a) inserting end sections of at least two electrical wires into an apparatus that comprises:
  (i) an electrical connector;
  (ii) a deformable insulating sleeve that surrounds and retains said electrical connector; and
  (iii) an encapsulant disposed within said insulating sleeve, said encapsulant having a cone penetration value of 100 to 350 ($10^{-1}$ mm) and an ultimate elongation of at least 200%; and
 (b) exerting pressure on said electrical connector through said insulating sleeve, thereby permanently deforming the connector to electrically connect said electrical wires and encapsulate the electrical connection within the encapsulant.

The end sections of the wires can be stripped of insulation before being inserted into the connector, which, when it is crimped, mechanically deforms the end sections so that they are in physical as well as electrical contact. Alternatively the insulation can be left on the wires, in which case the connector must comprise an insulation displacing member which, when the connector is crimped, displaces insulation on the end sections and effects electrical connection between the wires.

BRIEF DESCRIPTION OF THE DRAWING

The invention is illustrated in the accompanying drawing in which.

DETAILED DESCRIPTION OF THE INVENTION

Figure 1:
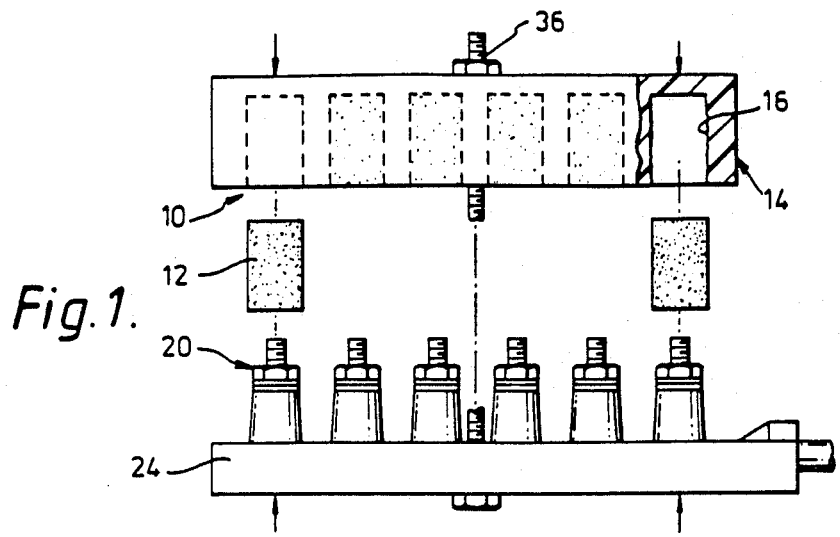
FIG. 1 is a cross-sectional view of a first embodiment of the present invention.

The invention is described herein mainly by reference to an in-line crimp splicer as shown in FIG. 1, but it is to be understood that the invention extends to electrical pressure connectors, generally, and therefore further encompasses e.g. pigtail connectors (or wire joints). It is also noted that the invention may be practiced when it is desired to connect two or more electrical wires.

Attention, accordingly, is directed to FIG. 1 which shows a cross-sectional view of a crimp splicer 10. The crimp splicer 10 includes three elements: a connector 12, an insulating sleeve 14 and an encapsulant 16. These elements are now discussed in detail, but it is to be understood that the various features disclosed with reference to FIG. 1 are also applicable, mutatis mutandis, to other pressure connectors of the invention.

The connector 12 is preferably cylindrical or barrel shaped and consists of a ductile metal which is a good conductor and is capable of being deformed with a crimping device (not shown). Suitable metals are copper, aluminum or brass. The connector 12 is also provided with a centrally located conductor stop 18 formed by perforating one side of the wall of the connector 12 and forcing a portion of the wall into the interior of the connector 12.

The insulating sleeve 14 is generally cylindrically-shaped and has a bore formed therein which runs the length of the sleeve. The sleeve 14 is shaped and sized to enable mechanical retention of the connector 12 disposed within the bore of the sleeve 14. Suitable materials for the sleeve 14 include nylon and polyvinylidene fluoride, since the necessary crimping force can be applied through these materials, in an appropriate manner well known in the art, without damage to the insulating sleeve or loss of retention of the connector 12.

The encapsulant 16 has a cone penetration value of 100 to 350 ($10^{-1}$ mm), preferably 100 to 250. (Note that the cone penetration value is determined in accordance with the American National Standard Designation ASTM D217-68 on an undisturbed sample at 70° F.±5° F. using a standard 1:1 scale cone (cone weight 102.5g, shaft weight 47.5g), the penetration being measured after 5 seconds). Further, the encapsulant 16 has an ultimate elongation of at least 200%, at least 500% or at least 750%; and generally has a maximum tensile strength of approximately 20 psi. (Note that these parameters are determined in accordance with the American National Standard Designation ASTM D638-80, at 70° F.±5° F., using a Type 4 die to cut the sample and at a speed of 50 cm/minute).

The encapsulant 16 may be prepared by gelling a liquid mixture comprising suitable gel precursor materials, eg. polyurethane or polysiloxane precursor materials, together with suitable reactive or non-reactive extenders. For example, suitable encapsulants can be made by gelling a mixture comprising conventional curable polyurethane precursor materials in the presence of substantial quantities of a mineral or vegetable oil or a mixture thereof (eg. in amount 60 to 80%) or a suitable plasticizer, eg. a trimellitate such as n-octyl-n-decyl trimellitate (eg. in amount 30 to 70%). A suitable reactive extender for polyurethane precursors is a mixture of mineral and vegetable oils in which the ratio by weight of mineral oil to vegetable oil is 0.7 to 2.4, the mixture of oils being present in amount 80 to 60%, preferably 80 to 70%, by weight based on the total weight of the polyurethane precursor materials and the mixture of mineral and vegetable oils. The encapsulant 16 may contain known additives such as moisture scavengers (e.g. benzoyl chloride), antioxidants, fillers, pigments, and fungicides. Especially when the wires are crimped into direct physical contact, the encapsulant can contain abrasive fillers which will pierce through any oxide or other passivating layer on the conductors, particularly aluminum conductors, especially in medium and high voltage joints. Other specific compositions for encapsulant 16 are conceivable and may be employed within the scope of the present invention. For example, the composition may be prepared by curing reactive silicones dissolved in non-reactive extender silicones. The encapsulant 16 is electrically insulating and preferably has a volume resistivity of at least $10^9$ ohms centimeter. Additionally, the encapsulant 16 is hydrolytically stable, moisture insensitive, substantially inert towards the insulating sleeve 14 and tacky.

Note that it is advantageous to dispose the encapsulant 16 within the sleeve 14 so that it substantially fills up the bore which runs the length of the sleeve 14. In this manner, the electrical wires 20 and 22 penetrate the encapsulant 16, which then seals behind the inserted wires 20 and 22. Moreover, the encapsulant 16 is voided from the area of electrical contact by the mechanical pressure generated during the crimping step (b) above. In this way, consequently, the present invention provides an electrical splice: the encapsulant 16 ensures that the splice protects the electrical wires 20 and 22 from a corrosive, moist or hazardous environment. In an alternative embodiment of the present invention, not shown, the sleeve 14 is provided with flexible endguards which shield and protect the encapsulant 16 from dust and incidental contact with solvents.

Figure 2:
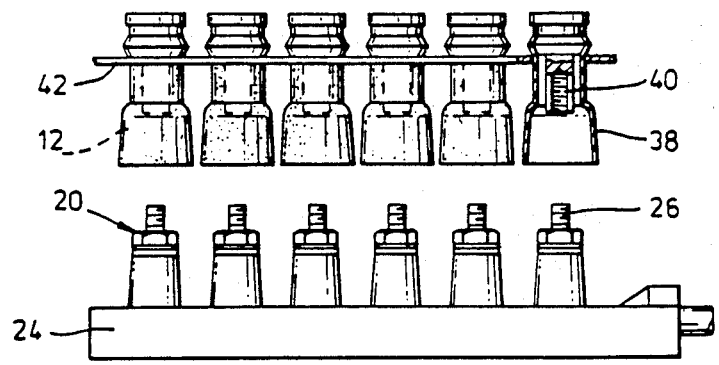
FIGS. 2, 3, 4 and 5 are cross-sectional views of a second embodiment of the present invention and the use thereof.

The apparatus of the present invention also extends to a "B-Wire" connector 24 of the type shown in FIG. 2. Here, a connector 26 which is covered with an insulated layer 28 is adapted to receive insulated electrical wires (numerals 30,32). The apparatus comprises an insulation-displacing member which, when the connector 24 is crimped around insulated electrical wires placed within the connector, displaces insulation on the electrical wires and effects electrical connection between the wires.

Figure 3:
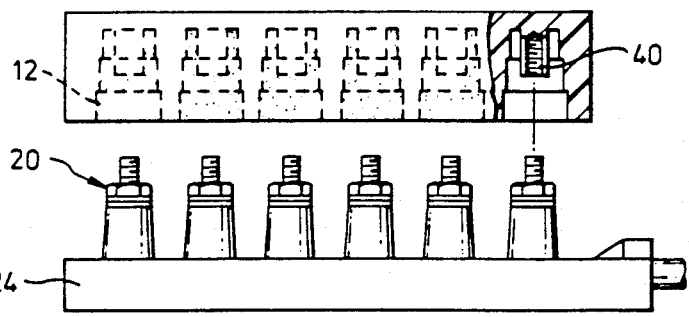
Figure 4:
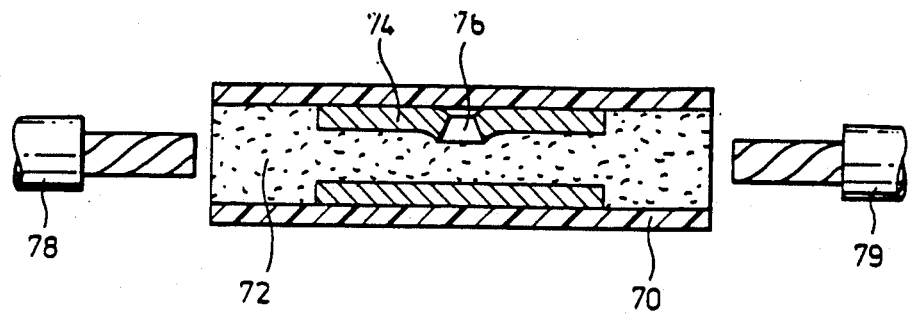
Figure 5:
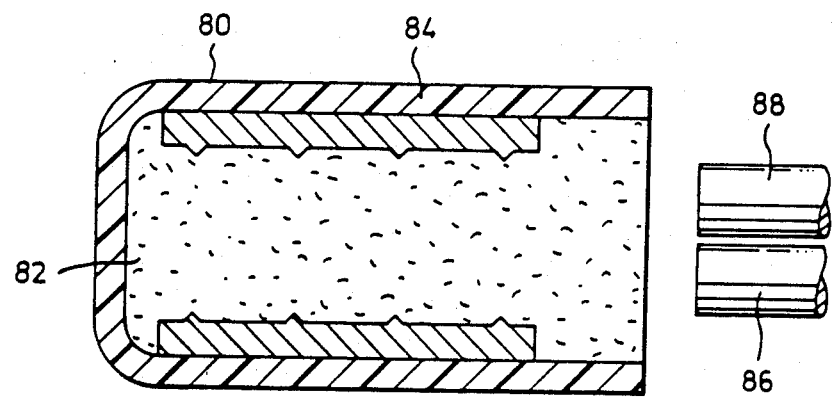

FIG. 3 shows wires 30 and 32 inserted into encapsulant 16 and connector 24, thereby penetrating encapsulant 16. When the wires are inserted into the connector, a portion of encapsulant 16 is forced out of the connector, as shown by the portion of encapsulant at 16a. FIG. 4 shows connector 24 after it has been deformed inward, or crimped, to form the crimp connection thereby voiding the encapsulant from between wires 30, 32 and connecting member 26. The crimping action to form the final connection forces additional encapsulant from the connector to seal behind the wires, as shown by the portion of the encapsulant 16b.

The present invention, in summary, may be employed to maintain an acceptable electrical connection between spliced wires by encapsulating and hence sealing the electrical connection from an adverse environment. Although specific embodiments of the present invention have been described herein, it will be obvious to those skilled in the art that various modifications may be made without departing from the spirt of the invention. With the foregoing in mind, it is understood that the invention be accorded the full scope of the appended claims.

I claim:

1. An article for splicing electrical wires, comprising:
   (a) an electrical connector which is adapted to receive electrical wires and to be mechanically deformed to electrically connect the electrical wires received therein;
   (b) an insulating sleeve adapted to surround and retain said connector; and
   (c) an encapsulant disposed and positioned within said electrical connector, so that electrical wires received therein penetrate the encapsulant said encapsulant having been gelled to form a solid having a cone penetration value of 100 to 350 ($10^{-1}$ mm) and an ultimate elongation of at least 200%.

2. An article as recited in claim 1, wherein the electrical connector is surrounded and retained by the sleeve, and is adapted to be mechanically crimped through said sleeve.

3. An article as recited in claim 1 wherein the encapsulant is an oil-extended polyurethane.

4. An article as recited in claim 3, wherein the encapsulant has been prepared by gelling a liquid mixture comprising 20 to 40% of curable polyurethane precursor materials and 80 to 60% of a mixture of mineral oil and vegetable oil in which the ratio by weight of mineral oil to vegetable oil is 0.7 to 2.4; the percentages being by weight based on the total weight of the polyurethane precursor materials and the mixture of mineral and vegetable oils.

5. An article as recited in claim 1, wherein the encapsulant is a plasticized polyurethane.

6. An article as recited in claim 1, wherein said cone penetration value is 100 to 200 ($10^{-1}$ mm).

7. An article as recited in claim 1, wherein said encapsulant has an ultimate elongation of at least 500%.

8. An article as recited in claim 1 wherein the connector is adapted to receive insulated electrical wires and comprises an insulation-displacing member which, when the connector is crimped around insulated electrical wires placed within the connector, displaces insulation on the electrical wires and effects electrical connection between the wires.

9. An article as recited in claim 1 wherein the connector is adapted to receive electrical wires having end sections which are free of insulation and which, when the connector is crimped around such wires placed within the connector, mechanically deforms the wires so that they are in physical and electrical contact with the connector.

10. An article as recited in claim 1 wherein said sleeve is provided with flexible end-guards to protect said encapsulant.

11. The article as recited in claim 1, wherein the cone penetration value is 100 to 250 ($10^{-1}$ mm).

12. A process for splicing electrical wires, comprising the steps of:
  (a) inserting end sections of at least two electrical wires in an article that comprises:
    (i) an electrical connector adapted to receive electrical wires and to be mechanically deformed to electrically connect the electrical wires received therein;
    (ii) a deformable insulating sleeve that surrounds and retains said electrical connector; and
    (iii) an encapsulant disposed and positioned within said electrical connector so that electrical wires received therein penetrate the encapsulant, said encapsulant having been gelled to form a solid having a cone penetration value of 100 to 350 ($10^{-1}$ mm) and an ultimate elongation of at least 200%; and
  (b) exerting pressure on said electrical connector through said insulating sleeve, thereby permanently deforming the connector to displace the encapsulant from between the wires and the connector to thereby electrically connect said electrical wires and encapsulate the electrical connection within the encapsulant.

13. A process as recited in claim 12, wherein the encapsulant is an oil-extended polyurethane.

14. A process as recited in claim 12, wherein the encapsulant has been prepared by gelling a liquid mixture comprising 20 to 40% of curable polyurethane precursor materials and 80 to 60% of a mixture of mineral oil and vegetable oil in which the ratio by weight of mineral oil to vegetable oil is 0.7 to 2.4; the percentages being by weight based on the total weight of the polyurethane precursor materials and the mixture of mineral and vegetable oils.

15. A process as recited in claim 12, wherein the encapsulant is a plasticized polyurethane.

16. A process as recited in claim 12, wherein said cone penetration value is 100 to 200 ($10^{-1}$ mm).

17. A process as recited in claim 12, wherein said cone penetration value is 200 to 300 ($10^{-1}$ mm).

18. A process as recited in claim 12, wherein said encapsulant has an ultimate elongation of at least 500%.

19. A process as recited in claim 12, wherein said encapsulant has an ultimate elongation of at least 750%.

20. A process as recited in claim 12 wherein said end sections are insulated and the connector comprises an insulation displacing member which, when the connector is crimped, displaces insulation on the end sections and effects electrical connection between the wires.

21. A process as recited in claim 12 wherein said end sections are free of insulation and the connector, when it is crimped, mechanically deforms the end sections so that they are in physical and electrical contact.

* * * * *

UNITED STATES PATENT AND TRADEMARK OFFICE
CERTIFICATE OF CORRECTION

PATENT NO. : 4,864,725

DATED : Sep. 12, 1989

INVENTOR(S) : Christian A. M. Debbaut

It is certified that error appears in the above-identified patent and that said Letters Patent is hereby corrected as shown below:

The title page showing the illustrative figure should be deleted to appear as per attached title page.

Sheets 1 and 2 of the drawings, consisting of Figs. 1-5, should be deleted to be replaced with the 2 drawing sheets, consisting of Figs 1-4, as shown on the attached sheets.

In column 2, line 27, "FIGS. 2, 3, 4 and 5" should be corrected to read --FIGS. 2, 3 and 4--.

Signed and Sealed this

Eleventh Day of June, 1991

Attest:

HARRY F. MANBECK, JR.

Attesting Officer     Commissioner of Patents and Trademarks

United States Patent [19]

Debbaut

[11] Patent Number: 4,864,725
[45] Date of Patent: Sep. 12, 1989

[54] ELECTRICAL CONNECTOR AND METHOD OF SPLICING WIRES

[75] Inventor: Christian A. M. Debbaut, Cary, N.C.

[73] Assignee: Raychem Corporation, Menlo Park, Calif.

[21] Appl. No.: 183,546

[22] Filed: Apr. 18, 1988

Related U.S. Application Data

[63] Continuation of Ser. No. 38,415, Apr. 9, 1987, abandoned, which is a continuation of Ser. No. 756,559, Jul. 17, 1985, abandoned, which is a continuation of Ser. No. 507,433, Jun. 23, 1983, abandoned, which is a continuation-in-part of Ser. No. 434,011, Oct. 12, 1982, Pat. No. 4,600,261.

[51] Int. Cl.$^4$ .................... H01R 43/04; H01R 4/00
[52] U.S. Cl. .................... 29/871; 174/89 C; 174/93; 428/904; 524/848
[58] Field of Search .......... 29/858, 868, 871, 872; 174/76, 84 C, 84 R, 85, 88 C, 92, 93; 524/157, 267, 491, 848; 264/272.11; 428/904

[56] References Cited

U.S. PATENT DOCUMENTS

| | | | |
|---|---|---|---|
| Re. 30,321 | 7/1980 | Brauer et al. | 260/18 |
| Re. 31,389 | 9/1983 | Brauer et al. | 210/321.3 |
| 3,065,292 | 11/1962 | Chickvary | |
| 3,187,088 | 6/1965 | Warner | |
| 3,228,820 | 1/1966 | Samson | 156/307 |
| 3,243,211 | 3/1966 | Wetmore | 287/78 |
| 3,427,393 | 2/1969 | Masterson | |
| 3,485,787 | 12/1969 | Haefele et al. | 260/33.6 |
| 3,619,481 | 11/1971 | Smith | |
| 3,630,905 | 12/1971 | Sorgo | 260/85.1 |
| 3,649,436 | 5/1970 | Buese | 161/160 |
| 3,676,387 | 7/1972 | Lindlof | 260/28.5 |
| 3,678,174 | 7/1972 | Ganzhorn | |
| 3,714,110 | 1/1973 | Verdol et al. | |
| 3,718,619 | 2/1973 | Rustab | |
| 3,731,258 | 5/1973 | Spicer | |
| 3,755,241 | 8/1973 | Brady | |
| 3,801,532 | 4/1974 | Olstowski | |
| 3,827,999 | 8/1974 | Crossland | 260/33.6 |
| 3,846,355 | 11/1974 | Mayer | |
| 3,897,129 | 7/1975 | Farrar, Jr. | |
| 3,916,082 | 10/1975 | Gillemot | |
| 3,928,704 | 12/1975 | Heidingsfeld et al. | 428/260 |
| 3,929,949 | 12/1975 | Day et al. | 264/46.4 |
| 3,934,076 | 1/1976 | Smith | 174/87 |
| 3,937,870 | 2/1976 | Bumpstead et al. | 174/87 |
| 3,985,951 | 10/1976 | Harris | |
| 4,010,994 | 3/1977 | Aysta | |
| 4,025,717 | 5/1977 | Whittingham | |
| 4,039,742 | 8/1977 | Smith | 174/87 |
| 4,168,258 | 9/1979 | Brauer et al. | 260/33.6 |
| 4,171,998 | 10/1979 | Brauer et al. | 156/48 |
| 4,176,239 | 11/1979 | Brauer et al. | 174/23 |
| 4,208,788 | 6/1980 | Siden | 29/862 |
| 4,214,121 | 7/1980 | Charneski et al. | |
| 4,231,986 | 11/1980 | Brauer et al. | |
| 4,281,210 | 7/1981 | Brauer et al. | 179/23 |
| 4,297,155 | 10/1981 | Jervis | |
| 4,326,767 | 4/1982 | Silbernagel et al. | |
| 4,369,284 | 1/1983 | Chew | |
| 4,423,918 | 1/1984 | Filreis et al. | |
| 4,504,699 | 3/1985 | Dones et al. | |

FOREIGN PATENT DOCUMENTS

| | | | |
|---|---|---|---|
| 46063 | 2/1982 | European Pat. Off. | |
| 2070658 | 9/1981 | United Kingdom | 1/64 |

OTHER PUBLICATIONS

ASTM Designation 50/69(79) Std Test Methods for Cone Penetration of Lubricating Grease.

*Primary Examiner*—Howard N. Goldberg
*Assistant Examiner*—Carl J. Arbes
*Attorney, Agent, or Firm*—Burns, Doane, Swecker & Mathis

[57] ABSTRACT

An article and process for splicing electrical wires that are to be exposed to an adverse environment. The article includes a connector, an insulating sleeve adapted to retain the connector, and an encapsulant. The encapsulant, which is disposed within the insulating sleeve, has a cone penetration value of 100 to 350 ($10^{-1}$ mm) and an ultimate elongation of at least 200%.

21 Claims, 2 Drawing Sheets

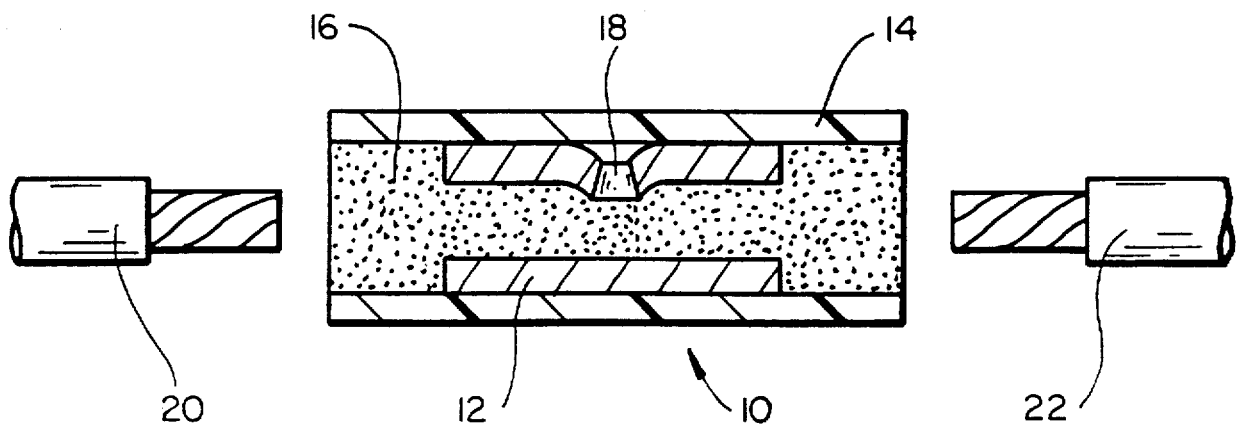

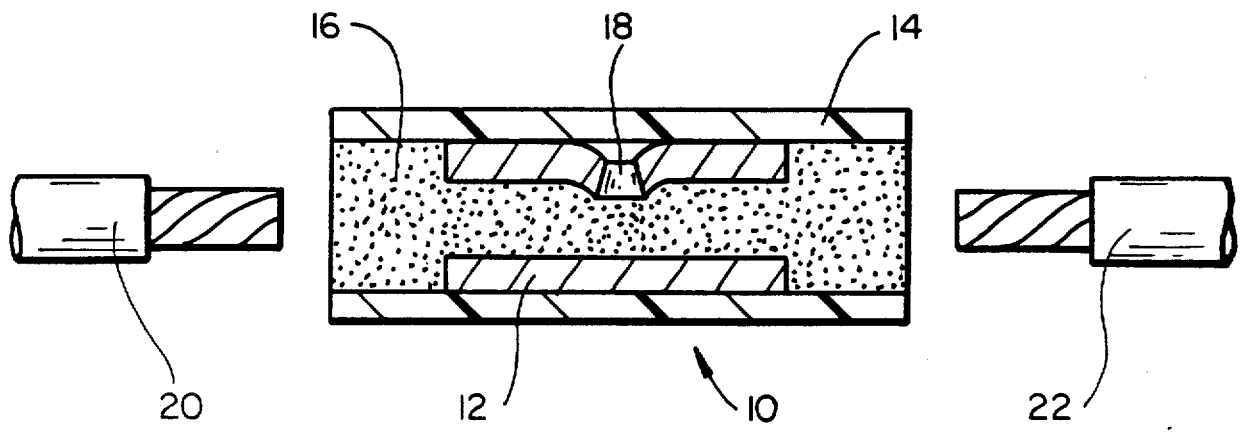
FIG_1
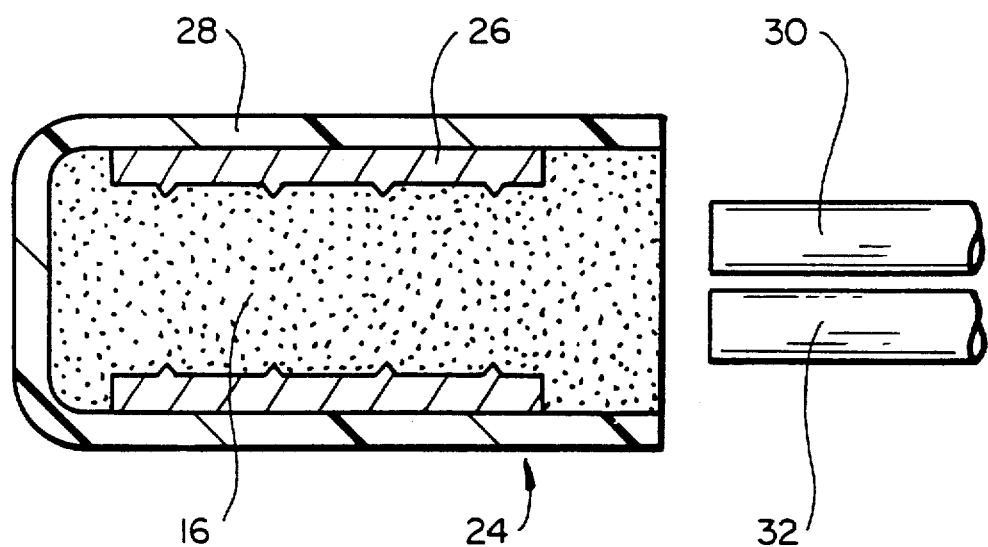
FIG_2

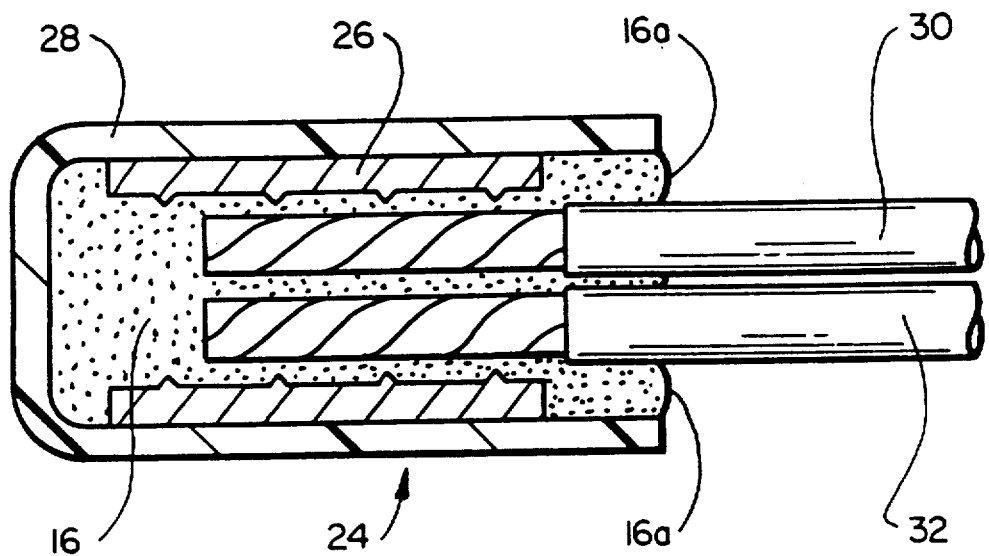
FIG_3
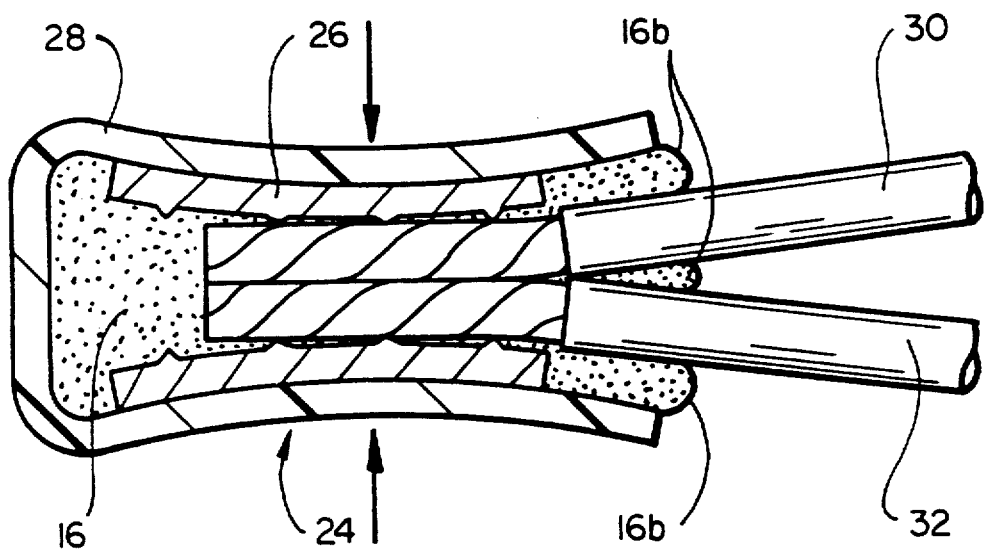
FIG_4